United States Patent
Kochersperger et al.

(10) Patent No.: US 7,999,939 B2
(45) Date of Patent: Aug. 16, 2011

(54) REAL TIME TELECENTRICITY MEASUREMENT

(75) Inventors: Peter C. Kochersperger, Easton, CT (US); Roberto B. Wiener, Ridgefield, CT (US)

(73) Assignee: ASML Holding N.V., Veldhoven (NL)

(*) Notice: Subject to any disclaimer, the term of this patent is extended or adjusted under 35 U.S.C. 154(b) by 688 days.

(21) Appl. No.: 11/840,822

(22) Filed: Aug. 17, 2007

(65) Prior Publication Data
US 2009/0046278 A1    Feb. 19, 2009

(51) Int. Cl.
G01B 11/00    (2006.01)
(52) U.S. Cl. ...................................................... 356/400
(58) Field of Classification Search .......... 356/399–401, 356/614, 124–128, 138, 139.03, 139.1, 140, 356/141.2, 141.3, 141.5, 147, 150, 15, 4; 430/5, 22, 30; 382/151; 250/548; 56/399–401; 563/399–401
See application file for complete search history.

(56) References Cited

U.S. PATENT DOCUMENTS

| | | | | |
|---|---|---|---|---|
| 5,272,501 | A * | 12/1993 | Nishi et al. | 355/53 |
| 5,739,899 | A * | 4/1998 | Nishi et al. | 355/53 |
| 7,180,573 | B2 * | 2/2007 | Lipson et al. | 355/53 |
| 2004/0130561 | A1 * | 7/2004 | Jain | 345/694 |
| 2006/0017902 | A1 * | 1/2006 | Rhyzhikov et al. | 355/67 |

FOREIGN PATENT DOCUMENTS

| | | |
|---|---|---|
| JP | 08-313842 A | 11/1996 |
| JP | 2007-036038 A | 2/2007 |

OTHER PUBLICATIONS

English language Abstract of Japanese Patent Publication No. 08-313842 A, published Nov. 29, 1996, Japanese Patent Office, 1 page.
English language Abstract of Japanese Patent Publication No. 2007-036038 A, published Feb. 8, 2007, Japanese Patent Office; 1 page.
English translation of Japanese Notification of Reasons for Refusal directed to related Japanese Patent Application No. 2008-208860, Japanese Patent Office, mailed Apr. 26, 2011; 3 pages.

* cited by examiner

Primary Examiner — Tarifur R Chowdhury
Assistant Examiner — Michael LaPage
(74) Attorney, Agent, or Firm — Sterne, Kessler, Goldstein & Fox P.L.L.C.

(57) ABSTRACT

Systems and methods are provides for measuring and correcting for a given telecentricity in a lithographic apparatus. A radiation beam is partitioned into a plurality of beams, each of which is modulated using an array of individually controllable elements and projected onto a portion of a substrate through a projection system. A set of alignment beams is transmitted simultaneously on paths similar to those traversed by the plurality of radiation beams, and a corresponding set of sensors respectively measures an angle and a position of the set of alignment beams proximate to an entrance of the projection system. An assembly of telecentricity control mirrors (TCM) adjusts appropriate ones of the plurality of radiation beams in response to the measurement to correct for any detected telecentricity errors.

33 Claims, 9 Drawing Sheets

REAL TIME TELECENTRICITY MEASUREMENT

BACKGROUND

1. Field of the Invention

The present invention relates to the measurement and correction of telecentricity in a lithographic apparatus.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, light is directed to a patterning device, which can be referred to as a mask, a reticle, an array of individually programmable or controllable elements (maskless), or the like. The patterning device can be used to generate a circuit pattern corresponding to an individual layer of an IC, flat panel display, or other device. This pattern can be transferred onto all or part of the substrate (e.g., a glass plate, a wafer, etc.), by imaging onto a layer of radiation-sensitive material (e.g., resist) provided on the substrate. The imaging can include the processing of light through a projection system, which can include optical components such as mirrors, lenses, beam splitters, and the like. Other components or devices can exist in a lithographic apparatus that can also contain optical components, such as a multi-field relay (MFR), which contains optical components to divide a radiation beam into a number of individual beams prior to patterning.

Lithography requires the projection of patterns onto a substrate with a high degree of accuracy. However, relative movement between the optical components of the lithographic apparatus may affect the alignment of the apparatus and induce telecentricity effects that degrade the accuracy of the projected pattern. In particular, the projection system may be especially sensitive to telecentricity induced by relative movement between the critical optical components of the illumination system.

In general, maskless lithographic apparatus are more sensitive to telecentricity than are mask-based lithographic apparatus. The increased sensitivity to telecentricity experienced by many generally-known maskless lithographic apparatus results substantially from the lens magnification used within these apparatus. The lens magnification employed by many maskless lithographic apparatus may be two orders of magnitude larger than the lens magnification in comparable mask-based lithographic apparatus. As sensitivity to telecentricity effects scales with lens magnification, the telecentricity tolerances required by common maskless lithographic apparatus may be two orders of magnitude tighter than those required by comparable mask-based lithographic apparatus. A similar telecentricity tolerance would be required in a mask-based lithographic apparatus that employs a lens magnification of magnitude similar to that commonly employed in maskless lithographic apparatus.

In an effort to reduce relative movement, the critical optical components of maskless lithographic apparatus are generally held stable with respect to each other on a number of isolated structures. Further, in order to ensure that projection is achieved at a high degree of accuracy, the lithographic apparatus may perform various calibration measurements, and in some instances, the lithographic apparatus may be adjusted in response to these measurements.

Unfortunately, it is difficult to completely eliminate relative movement between the optical components in lithographic apparatus. Further, existing calibration techniques are generally insufficient to perform real-time measurement and correction of telecentricity. These techniques often use actinic light to measure telecentricity, and the exposure of the substrate must be halted during measurement and subsequent alignment. As such, existing techniques to measure induced telecentricity in lithographic apparatus make inefficient use of actinic light and reduce the throughput of the lithographic apparatus.

SUMMARY

Systems and methods for measuring and correcting for telecentricity effects in a lithographic apparatus without impacting wafer throughput or wasting actinic light are provided.

In an embodiment, there is provided a lithographic apparatus including a partitioning device configured to partition a source radiation beam into a plurality of radiation beams. The apparatus also includes a set of sensors configured to measure at least one of an angle, a position, or an energy distribution of a set of corresponding alignment beams. Further, the apparatus includes an array of individually-controllable elements configured to correct each of the plurality of radiation beams in response to the measurement. The apparatus also includes a patterning array configured to pattern the corrected radiation beam and a projection system configured to project the plurality of patterned radiation beams onto a target of a substrate. In various examples, the correction may include adjusting an angle at which each of the plurality of radiation beams illuminate the patterning array.

In one example, the alignment beams may be generated by sources of non-actinic light positioned downstream from the module, and the sources of non-actinic radiation may include, but are not limited to, helium-neon (HeNe) lasers. In a second example, the alignment beams may comprise actinic light and may be partitioned from the source beam by the module. Further, in another example, the lithographic apparatus may include a lens positioned upstream of the module and configured to adjust a position and an angle of the source radiation beam in response to the measurement.

In another embodiment, there is provided a system for measuring and correcting for telecentricity in a lithographic apparatus includes a partitioning device configured to partition a source radiation beam into a plurality of radiation beams. The system also includes a set of sensors configured to measure at least one of an angle, a position, or an energy distribution of a set of corresponding alignment beams. Further, the system includes an array of individually-controllable elements configured to correct each of the plurality of radiation beams in response to the measurement. In various examples, the correction may include adjusting an angle at which each of the plurality of radiation beams illuminate a patterning device.

In one example, the alignment beams may be generated by sources of non-actinic light positioned downstream of the module, and the sources of non-actinic radiation may include, but are not limited to, helium-neon (HeNe) lasers. In a second example, the alignment beams may be partitioned from the source radiation beam by the module. Further, in another example, the system may include a lens positioned upstream of the module and configured to adjust the source radiation beam in response to the measurement.

In a further embodiment, there is provided a method of measuring and correcting for telecentricity in a lithographic apparatus includes measuring at least one of an angle, a position, or an energy distribution of each of three or more alignment beams. The method also includes adjusting each of a plurality of radiation beams in response to the measurement, and subsequently projecting each of the plurality of adjusted radiation beams onto a portion of a substrate. In one example, the adjusting step adjusts an angle at which each of a plurality of radiation beams illuminate a patterning array. In an additional example, at least one of a position and an angle of a source radiation beam is adjusted in response to the measurement.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 3:
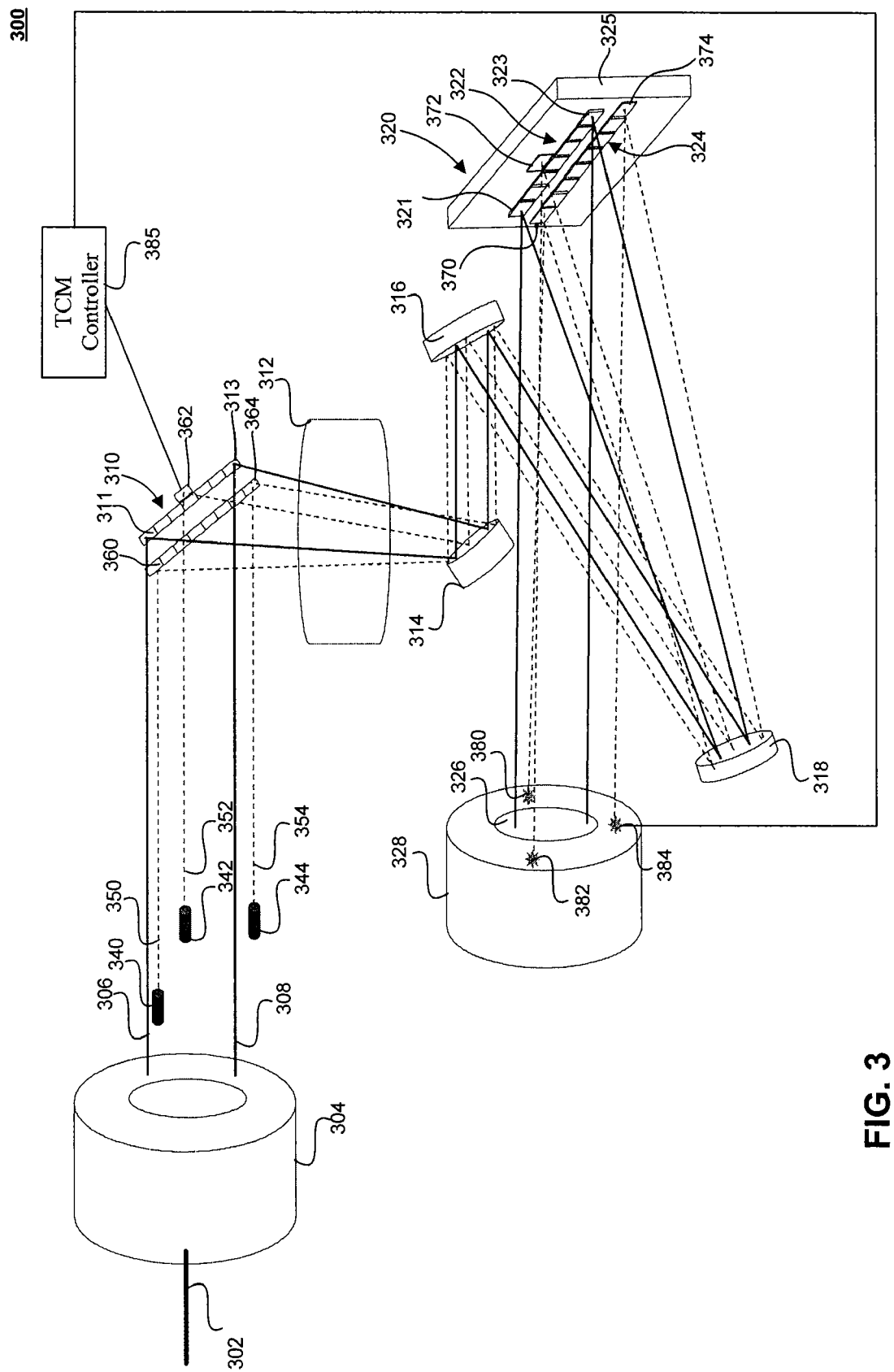
FIG. 3 depicts an exemplary system for measuring and correcting for telecentricity in a lithographic apparatus.
Figure 4:
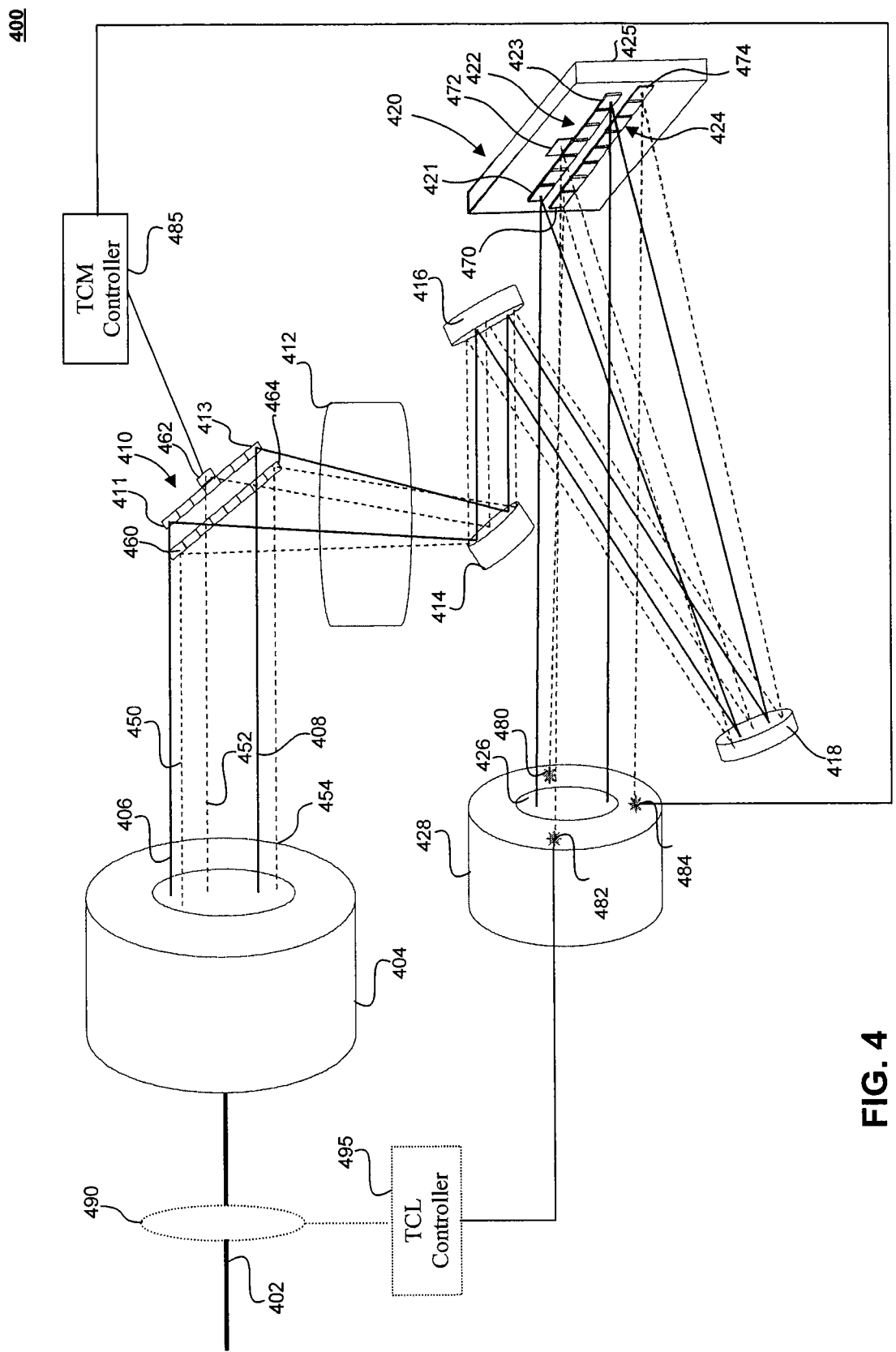
FIG. 4 depicts a second exemplary system for measuring and correcting for telecentricity in a lithographic apparatus.
Figure 5:
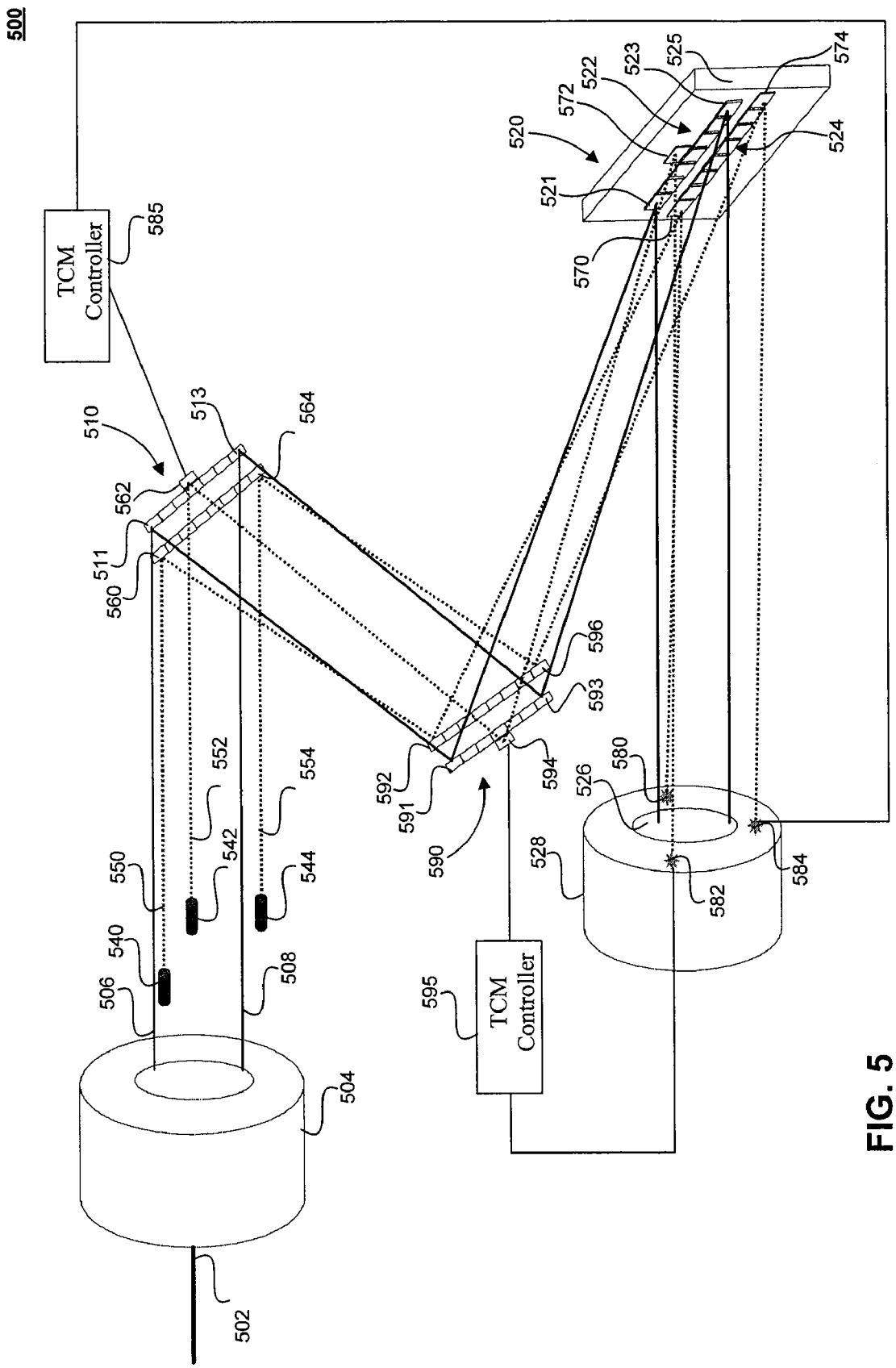
FIG. 5 depicts a third exemplary system for measuring and correcting for telecentricity in a lithographic apparatus.
Figure 8:
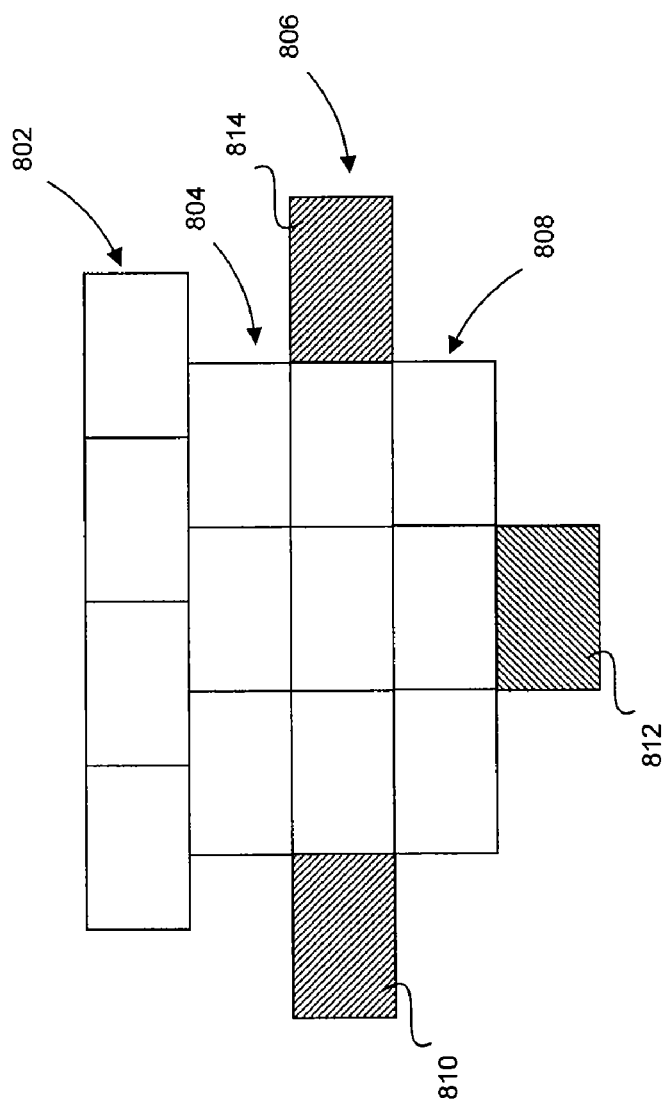

FIG. 8 schematically illustrates a multi-field relay (MFR) mask 600 that may be incorporated into the exemplary systems of FIGS. 3-5.

Figure 9:
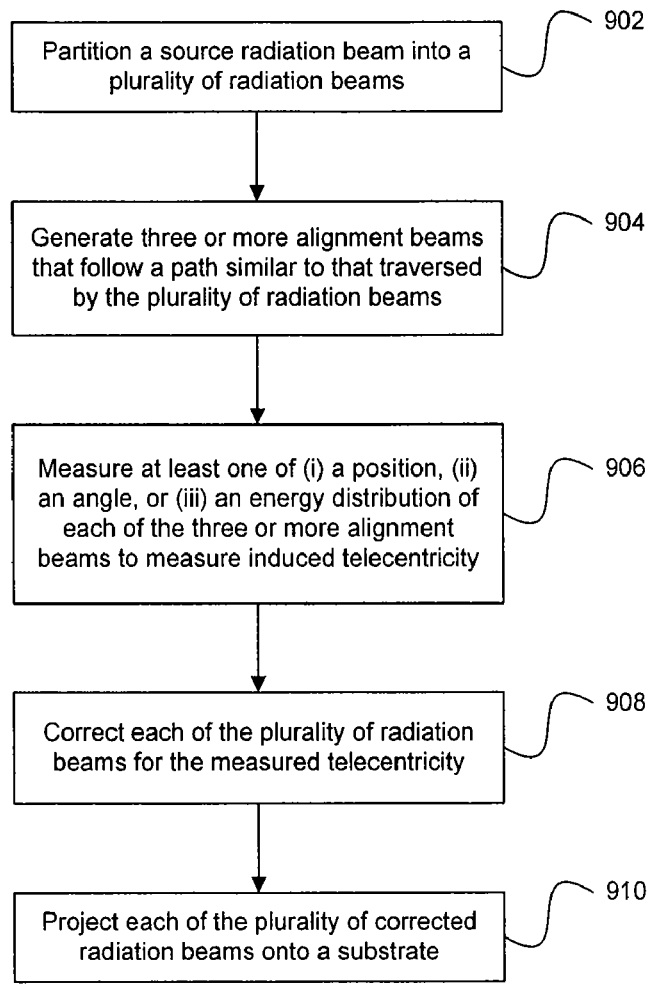

FIG. 9 depicts a flowchart for an exemplary method of measuring and correcting for telecentricity in a lithographic apparatus.

One or more embodiments of the present invention will now be described with reference to the accompanying drawings. In the drawings, like reference numbers can indicate identical or functionally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
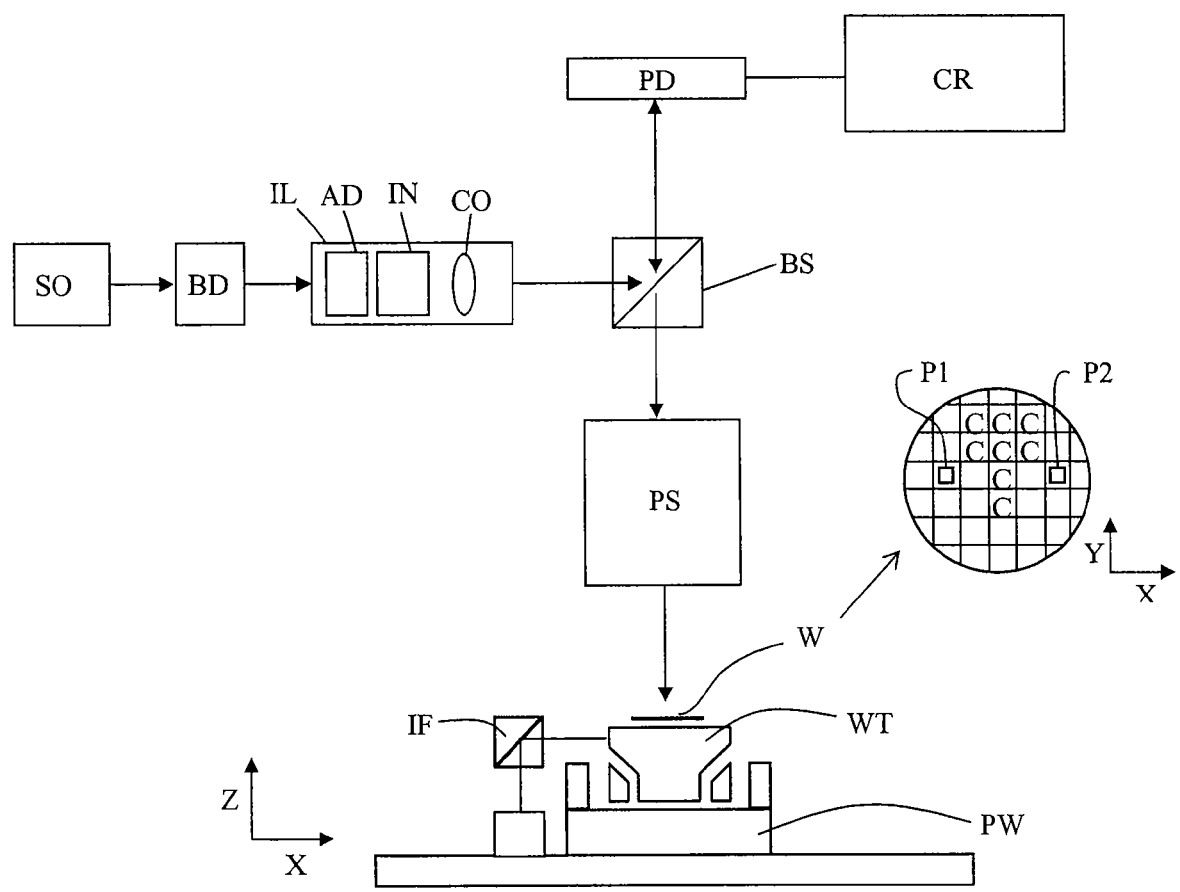
FIGS. 1 and 2 depicts exemplary lithographic apparatus.

FIG. 1 schematically depicts the lithographic apparatus of one embodiment of the invention. The apparatus comprises an illumination system IL, a patterning device PD, a controller CR, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The patterning device PD is connected to a controller CR that is configured to control the pattern provided on the patterning device. For example, controller CR may switch between a series of desired patterns on patterning device PD.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticule or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, iP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

As herein depicted in FIG. 1, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section.

The illuminator IL, or an additional component associated with it, can also be arranged to divide the radiation beam into a plurality of sub-beams that can, for example, each be associated with one or a plurality of the individually controllable elements of the array of individually controllable elements. In an additional embodiment, a two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

Combinations and/or variations on the above described modes of use or entirely different modes of use can also be employed.

Figure 2:
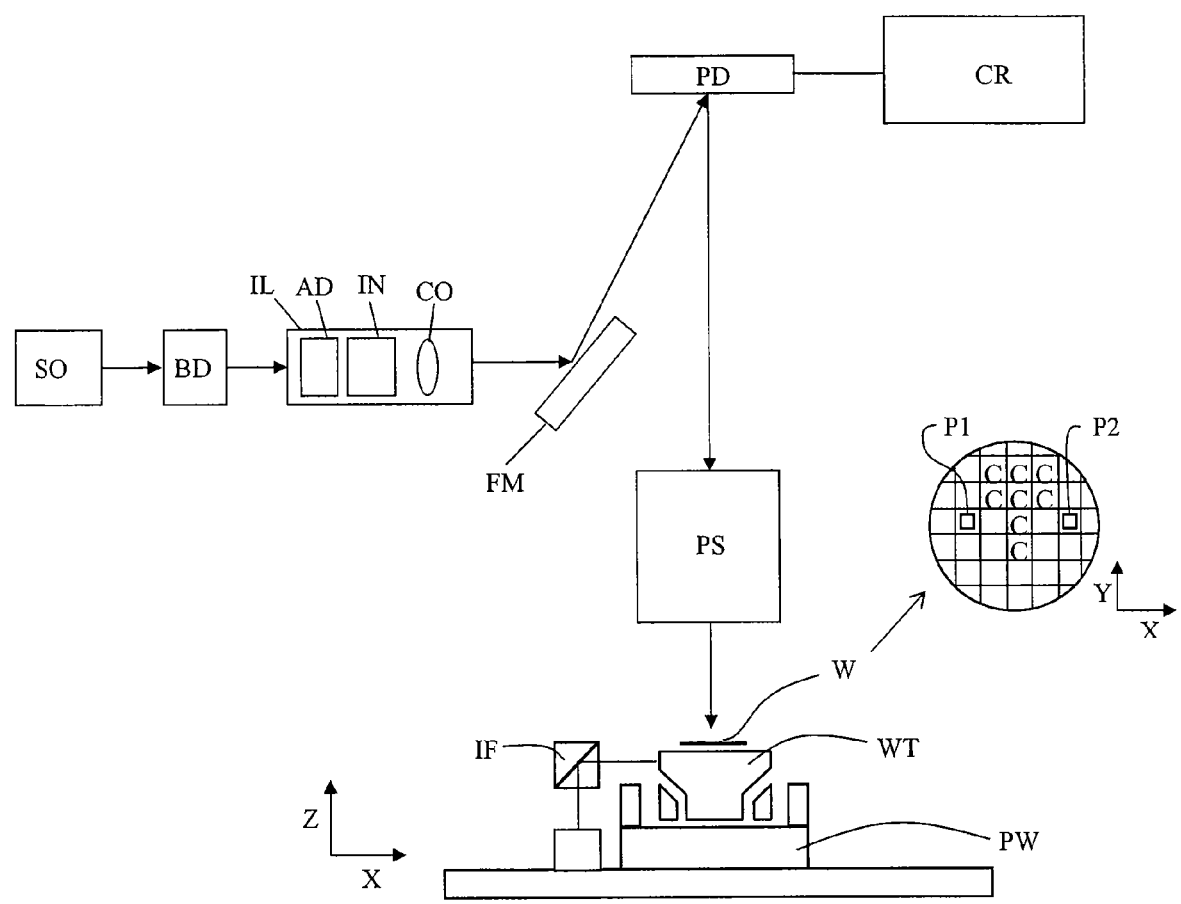

FIG. 2 depicts an arrangement of a lithographic apparatus, according to an embodiment of the present invention. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, a folding mirror FM directs the beam of radiation B from illuminator IL to patterning device PD. In contrast the embodiment of FIG. 1, folding mirror FM directs beam of radiation B towards patterning array PD non-orthogonally, e.g., beam of radiation B falls incident onto patterning array PD at an angle less that 90°. In various embodiments, folding mirror FM may direct beam of radiation B towards patterning device PD at an angle between 0 and 90°, between 5 and 85°, between 15 and 75°, between 25 and 65°, or between 35 and 55°. Patterning device PD then modulates beam of radiation B and transmits the modulated beam to projection system PS, which is configured to project the beam of radiation modulated by the array of individually controllable elements onto a target portion C (e.g., comprising one or more dies) of substrate W.

Lithography requires the projection of patterns onto a substrate with a high degree of accuracy. However, relative movement between the optical components of the lithographic apparatus may induce telecentricity effects that alter the alignment of the radiation beams, and hence, degrade the accuracy of the projected patterns. Further, in order to ensure that projection is achieved at the required degree of accuracy, the lithographic apparatus may perform various calibration measurements (e.g., measurements of the induced telecentricity), and in some instances, the lithographic apparatus may be adjusted in response to these measurements.

FIG. 3 depicts an exemplary system 300 that measures and corrects for telecentricity in a lithographic apparatus, according to an embodiment of the present invention. Exemplary system 300 measures the telecentricity induced by relative motion between critical optical components of the lithographic apparatus, including, but not limited to, a multi-field relay (MFR) module 304, an assembly 310 of individually-controllable mirror elements, a patterning device 320, and a projection system 328. Exemplary system 300 then corrects for the induced telecentricity in real time without the reduction in wafer throughput or the waste of actinic radiation that are characteristic of many generally known measurement techniques In the embodiment of FIG. 3, a source radiation beam 302 is incident on a multi-field relay (MFR) module 304. MFR module 304 includes critical optics (not shown) and a MFR mask (not shown) that collectively partition source beam 302 into a plurality of radiation beams, such as beams 306 and 308. Source beam 302 may represent a beam of UV radiation as provided by a mercury arc lamp, a beam of DUV radiation generated by a KrF excimer laser or an ArF excimer laser, or the like. Further, although not shown in FIG. 3, an additional module positioned upstream of MFR module 304 may condition source beam 302 to alter a shape of source beam 302 at a pupil or to alter an intensity of source beam 302.

Beams 306 and 308 illuminate an assembly 310 of individually-controllable mirror elements that respectively activate in response to a control signal from a controller 385 (e.g., a telecentricity control mirror (TCM) controller). In one embodiment, each individually-controllable mirror element is a telecentricity control mirror (TCM) that corrects one of a plurality of radiation beams for telecentricity. After interacting with assembly 310, beams 306 and 308 are directed towards a relay 312 and onto optical elements 314, 316, and 318 to illuminate a patterning device 320 (e.g., a patterning array).

In one embodiment, patterning array 320 may be a multiple SLM array (MSA) that is activated by a control signal according to a specific pattern. The MSA may comprise a plurality of SLMs arranged in rows 322 and 324 and supported by MSA plate 325, and each SLM within the MSA may modulate one of a plurality of incident radiation beams. For example, SLM 321 may modulate beam 306, and SLM 323 may modulate beam 308. Once patterned, beams 306 and 308 are subsequently projected onto a portion of a substrate (not shown) by projection system 328.

Relative movement between the optical components of the lithographic apparatus, such as MFR module 304, array 310, patterning array 320, and projection system 328, may affect the alignment of the apparatus and induce telecentricity effects that degrade the accuracy of the pattern projected by projection system 328. For example, projection system 328 may be especially sensitive to the telecentricity induced by relative motion between the optics of MFR module 304 and by relative motion between other optical components within the illumination system of the lithographic apparatus.

In order to measure and correct for any telecentricity induced by components of the lithography system, radiation sources 340, 342, and 344 are positioned downstream of MFR module 304 to generate, respectively, alignment beams 350, 352, and 354. In one embodiment, radiation sources 340, 342, and 344 may be helium-neon (HeNe) lasers, or alternatively, radiation sources 340, 342, and 344 may be an additional radiation source that does not generate actinic light.

Alignment beams 350, 352, and 354 respectively illuminate elements 360, 362, and 364 of assembly 310. In one embodiment, elements 360, 362, and 364 may be fixed mirrors that reflect the incident alignment beams. Alternatively, elements 360, 362, and 364 may be individually-controllable mirror elements responsive to a control signal from TCM controller 385. The alignment beams 350, 352, and 354 are subsequently directed through relay 312 and optical elements 314, 316, and 318 to illuminate patterning array 320. Fixed mirror elements 370, 372, and 374 within patterning array 320 respectively direct alignment beams 350, 352, and 354 towards sensors 380, 382, and 384. In one embodiment, sensors 380, 382, and 384 may be arranged about an entrance plane 326 of projection system 328 and may be positioned on a housing of projection system 328.

Sensors 380, 382, and 384 are configured to provide a real-time measurement of a position, an angle, and/or an energy distribution of respective alignment beams 350, 352, and 354, and thus, to provide a real-time measurement of the telecentricity induced within the lithographic apparatus. In one embodiment, sensors 380, 382, and 384 may measure, respectively, the position, the angle, and/or the energy distribution of beams 350, 352, and 354 in at least six degrees of freedom.

Sensors 380, 382, and 384 supply measurements of angle, position, and/or energy distribution to TCM controller 385. TCM controller 385 processes the received measurements and provides a control signal to appropriate ones of the individually-controllable elements of assembly 310. The control signal is used to activate the appropriate ones of the individually-controllable elements to substantially correct the incident beams 306 and 308 for any detected induced telecentricity. For example, controller 385 may provide a control signal that activates elements 311 and 312 to adjust an angle at which respective beams 306 and 308 respectively illuminate patterning array 320. Additionally, or alternatively, controller 385 may provide a control signal that activates elements 311 and 313 to adjust, respectively, a position and/or an angle of beams 306 and 308 in response to the measured energy distribution. This may be done to substantially correct the beams for the telecentricity, which may be induced by relative movement between optical components of the lithographic apparatus.

In FIG. 3, sensors 380, 382, and 384 may measure the angle, position, and energy distribution of the respective alignment beams 350, 352, and 354 at entrance plane 326 of projection system 328. Additionally, or alternatively, telecentricity errors may be measured at any point along the optical path of beams 306 and 308 by moving the location of sensors 380, 382, and 384. For example, sensors 380, 382, and 384 may be located proximate (e.g., near an entrance) relay 312, or at any additional location along the optical axis, and the measured position and angle of alignment beams 350, 352, and 354 may be used, via controller 385, to activate appropriate individually controllable elements of assembly 310.

In another embodiment, sources 340, 342, and 344 may be located proximate (e.g., near an entrance) MFR module 304, and sensors 380, 382, and 384 may be located proximate (e.g., near an exit) MFR module 304, to provide a direct measurement of any telecentricity that may be induced by the relative motion between optics within MFR module 304. Assembly 310 may then correct the plurality of radiation beams 306 and 308 for any detected induced telecentricity. Such an arrangement may be modified to measure any telecentricity induced by any particular module along the optical path of beams 306 and 308.

In yet another embodiment, sources 340, 342, and 344 may be located proximate (e.g., near an entrance) MFR module 304, and sets of sensors may be located proximate (e.g., near an exit) MFR module 304 and at various additional locations along the optical path of beams 306 and 308. Such arrangements facilitate the simultaneous measurement of any telecentricity induced by a number of optical components along the optical path of beams 306 and 308.

In the exemplary system of FIG. 3, measurements of the position, the angle, and the energy distribution of the non-actinic alignment beams 350, 352, and 354 provide a real-time measurement of any induced telecentricity. However, in additional embodiments, beams of actinic light may be used to measure any induced telecentricity in a maskless lithographic apparatus. Accordingly, FIG. 4 depicts another exemplary system 400 that uses actinic light to measure and corrects for any induced telecentricity errors in a lithographic apparatus, such as the telecentricity induced by relative motion between MFR module 404, assembly 410 of individually-controllable elements 410, patterning array 420, and projection system, 428, according to an embodiment of the present invention.

In FIG. 4, a radiation beam 402 is incident upon a multi-field relay (MFR) module 404 that partitions beam 402 into a plurality of beams. In contrast to the exemplary system of FIG. 2, MFR module 404 simultaneously partitions source beam 402 into beams of actinic light, such as beams 406 and 408, which are subsequently patterned, using patterning device 420, and projected, using projection system 428, onto a substrate (not shown) and beams of actinic light that facilitate the measurement of induced telecentricity, such as alignment beams 450, 452, and 454.

Both the alignment beams 450, 452, and 454 and the radiation beams 406 and 408 illuminate an assembly 410 of individually-controllable mirror elements that may be activated in response to a signal from controller 485. In one embodiment, each individually-controllable mirror element within assembly 410 may be a telecentricity control mirror (TCM) positionable in two-degrees of freedom to correct an incident radiation beam for telecentricity.

In FIG. 4, elements 460, 462, and 464 are incorporated into assembly 410 to reflect, respectively, alignment beams 450, 452, and 454. In one embodiment, elements 460, 462, and 464 are fixed mirror elements, although in additional embodiments, elements 460, 462, and 464 may be individually-controllable elements responsive to a control signal from TCM controller 485.

Radiation beams 406 and 408, and alignment beams 450, 452, and 454, are subsequently directed through relay 412 and optical elements 414, 416, and 418 to illuminate a patterning device 420 (e.g., a patterning array). In one embodiment, patterning array 420 is a multiple SLM array (MSA) that may be activated by a control signal according to a specific pattern. The MSA comprises a plurality of SLMs arranged in rows 422 and 424 and supported by MSA plate 425, and each SLM within the MSA may modulate one of a plurality of incident radiation beams. For example, SLM 421 may modulate beam 406, and SLM 423 may modulate beam 408. The patterned beams 406 and 408 are subsequently projected onto a portion of a substrate (not shown) by a projection system 428.

In FIG. 4, mirror elements 460, 462, and 464 reflect, respectively, alignment beams 450, 452, and 454 onto sensors 480, 482, and 484. In one embodiment, sensors 480, 482, and 484 may be arranged proximate (e.g., near an entrance) plane 426 of projection system 428, additionally sensors 480, 482, and 484 may be located on a housing of projection system 428.

Sensors 480, 482, and 484 are configured to provide a real-time measurement of the position, angle, and/or energy distribution of alignment beams 450, 452, and 454, and hence, of a real-time measurement of any induced telecentricity within the lithographic apparatus. In one embodiment, sensors 480, 482, and 484 may measure the position, alignment, and energy distribution of the alignment beams 450, 452, and 454 in up to six degrees of freedom.

Sensors 480, 482, and 484 supply these measurements to TCM controller 485, which processes the measurements and provides a control signal to appropriate ones of the individually-controllable elements of assembly 410, thereby activating the appropriate elements and substantially correcting the incident beams 406 and 408 for any telecentricity induced by relative movement between optical components of the lithographic apparatus. For example, controller 485 may provide a control signal that activates elements 411 and 413 to adjust an angle at which beams 406 and 408 respectively illuminate patterning array 420, thus substantially correcting for any induced telecentricity in beams 406 and 408. Additionally, or alternatively, controller 485 may provide a control signal that activates elements 411 and 413 to adjust, respectively, an angle of beams 406 and 408 in response to the measured energy distribution.

In the embodiment of FIG. 4, sensors 480, 482, and 484 may provide real-time feedback on any induced telecentricity to an optical element positioned downstream from MFR module 404. However, measurements of position, angle, and energy distribution of the actinic alignment beams 406 and 408 may also provide feedback to correction elements positioned upstream of MFR module 404.

Additionally, or alternatively, a telecentricity control lens (TCL) 490 coupled to a TCL controller 495 may be positioned upstream of MFR module 404 to align source beam 402 in response to any telecentricity measured in beams 406 and 408. Sensors 480, 482, and 484 may supply measurements of any induced telecentricity to TCL controller 495, which processes the measurements and provides a control signal that moves TCL 490 to correct the alignment of source beam 402 for the effects of any telecentricity.

In additional embodiments, sensors 480, 482, and 484 may provide simultaneous feedback to correction elements positioned downstream of MFR module 404, such as TCM assembly 410, and upstream of MFR module 404, such as TCL 490.

The exemplary systems of FIGS. 3 and 4 are described in terms of three alignment beams (e.g., alignment beams 350, 352, and 354 of FIG. 3 and alignment beams 450, 452, and 454 of FIG. 4) that facilitate the measurement of telecentricity induced in two radiation beams (e.g., radiation beams 306 and 308 of FIG. 3 and beams 406 and 408 of FIG. 4). It would be apparent to one skilled in the art upon reading this description that the embodiments of FIGS. 3 and 4 may include any number of radiation beams partitioned from the source radiation beams, including, but not limited to, thirteen radiation beams or fourteen radiation beams. Further, it would also be apparent to one skilled in the art upon reading this description that additional configurations could incorporate any number of alignment beams and corresponding sensors.

In the exemplary systems of FIG. 3 and FIG. 4, a single assembly of individually-controllable mirrors adjusts the position and/or the angle of the radiation beams in response to measurements of induced telecentricity. However, in additional embodiments, multiple assemblies of individually-controllable mirror elements may be used to correct for telecentricity errors in a maskless lithographic apparatus. Accordingly, FIG. 5 depicts an exemplary system 500 that measures and corrects for telecentricity in a lithographic apparatus using multiple assemblies of individually-controllable mirrors, according to an embodiment of the present invention.

In the embodiment of FIG. 5, a source radiation beam 502 is incident on a multi-field relay (MFR) module 504. MFR module 504 includes critical optics (not shown) and a MFR mask (not shown) that collectively partition source beam 502 into a plurality of radiation beams, such as beams 506 and 508. Further, although not shown in FIG. 5, an additional module positioned upstream of MFR module 504 may condition source beam 502 to alter a shape of source beam 502 at a pupil or to alter an intensity of source beam 502.

In order to measure and correct for any telecentricity induced by components of the lithography system, radiation sources 550, 542, and 544 are positioned downstream of MFR module 504 to generate, respectively, alignment beams 550, 552, and 554. In one embodiment, radiation sources 540, 542, and 544 may be helium-neon (HeNe) lasers, or alternatively, radiation sources 540, 542, and 544 may be an additional radiation source that does not generate actinic light.

Both the alignment beams 550, 552, and 554 and the radiation beams 506 and 508 illuminate a first assembly 510 of individually-controllable mirror elements that may be activated in response to a signal from controller 585. In one embodiment, each individually-controllable mirror element within assembly 510 may be a telecentricity control mirror (TCM) positionable in two-degrees of freedom to correct an incident radiation beam for telecentricity.

In FIG. 5, elements 560, 562, and 564 are incorporated into assembly 510 to reflect, respectively, alignment beams 550, 552, and 554. In one embodiment, elements 560, 562, and 564 are fixed mirror elements, although in additional embodiments, elements 560, 562, and 564 may be individually-controllable elements responsive to a control signal from TCM controller 585.

In contrast to the exemplary systems of FIG. 3 and FIG. 4, radiation beams 506 and 508, and alignment beams 550, 552, and 554, subsequently illuminate a second assembly 590 of individually-controllable mirror elements that may be activated in response to a signal from controller 595. As described above, each individually-controllable mirror element within assembly 590 may be a telecentricity control mirror (TCM) positionable in two-degrees of freedom to provide additional correction to an incident radiation beam for telecentricity.

Elements 592, 594, and 596 are incorporated into second assembly 590 to reflect, respectively, alignment beams 550, 552, and 554. In one embodiment, elements 592, 594, and 596 are fixed mirror elements, although in additional embodiments, elements 592, 594, and 596 may be individually-controllable elements responsive to a control signal from TCM controller 595.

Radiation beams 506 and 508, and alignment beams 550, 552, and 554, then illuminate a patterning device 520 (e.g., a patterning array). In one embodiment, patterning array 520 is a multiple SLM array (MSA) that may be activated by a control signal according to a specific pattern. The MSA comprises a plurality of SLMs arranged in rows 522 and 524 and supported by MSA plate 525, and each SLM within the MSA may modulate one of a plurality of incident radiation beams. For example, SLM 521 may modulate beam 506, and SLM 523 may modulate beam 508. The patterned beams 506 and 508 are subsequently projected onto a portion of a substrate (not shown) by a projection system 528.

In FIG. 5, mirror elements 570, 572, and 574 reflect, respectively, alignment beams 550, 552, and 554 onto sensors 580, 582, and 584. In one embodiment, sensors 580, 582, and 584 may be arranged proximate (e.g., near an entrance) plane 526 of projection system 528, additionally sensors 580, 582, and 584 may be located on a housing of projection system 528.

Sensors 580, 582, and 584 are configured to provide a real-time measurement of a position, an angle, and/or an energy distribution of alignment beams 550, 552, and 554, and hence, of a real-time measurement of any induced telecentricity within the lithographic apparatus. In one embodiment, sensors 580, 582, and 584 may measure the position, the angle, and the energy distribution of the alignment beams 550, 552, and 554 in up to six degrees of freedom.

Sensors 580, 582, and 584 supply these measurements to TCM controllers 585 and 595, which respectively process the measurements and respectively provide a control signal to appropriate ones of the individually-controllable elements of first and second assemblies 510 and 590, thereby activating the appropriate elements and substantially correcting the incident beams 506 and 508 for any telecentricity induced by relative movement between optical components of the lithographic apparatus. For example, controller 585 may provide a control signal that activates elements 511 and 513 to adjust an angle at which beams 506 and 508 respectively illuminate second assembly 590, thus substantially correcting for any induced telecentricity in beams 506 and 508. Further, controller 595 may provide a control signal that activates elements 591 and 593 to adjust an angle and/or a position of beams 506 and 508 in response to the measured energy distribution, thus providing additional correction for any induced telecentricity in beams 506 and 508.

Additionally, a telecentricity control lens (TCL) (not shown), such as TCL 390 in FIG. 4, may be coupled to a TCL controller, such as TCL controller 495 of FIG. 4, and may be positioned upstream of MFR module 504 to align source beam 502 in response to any telecentricity measured in beams 506 and 508. Sensors 580, 582, and 584 may supply measurements of any induced telecentricity to the TCL controller, which processes the measurements and provides a control signal that moves the TCL to correct the alignment of source beam 502 for the effects of any telecentricity.

In additional embodiments, sensors 580, 582, and 584 may provide simultaneous feedback to correction elements positioned downstream of MFR module 504, such as TCM assemblies 510 and 590, and upstream of MFR module 504, such as a TCL.

Figure 6:
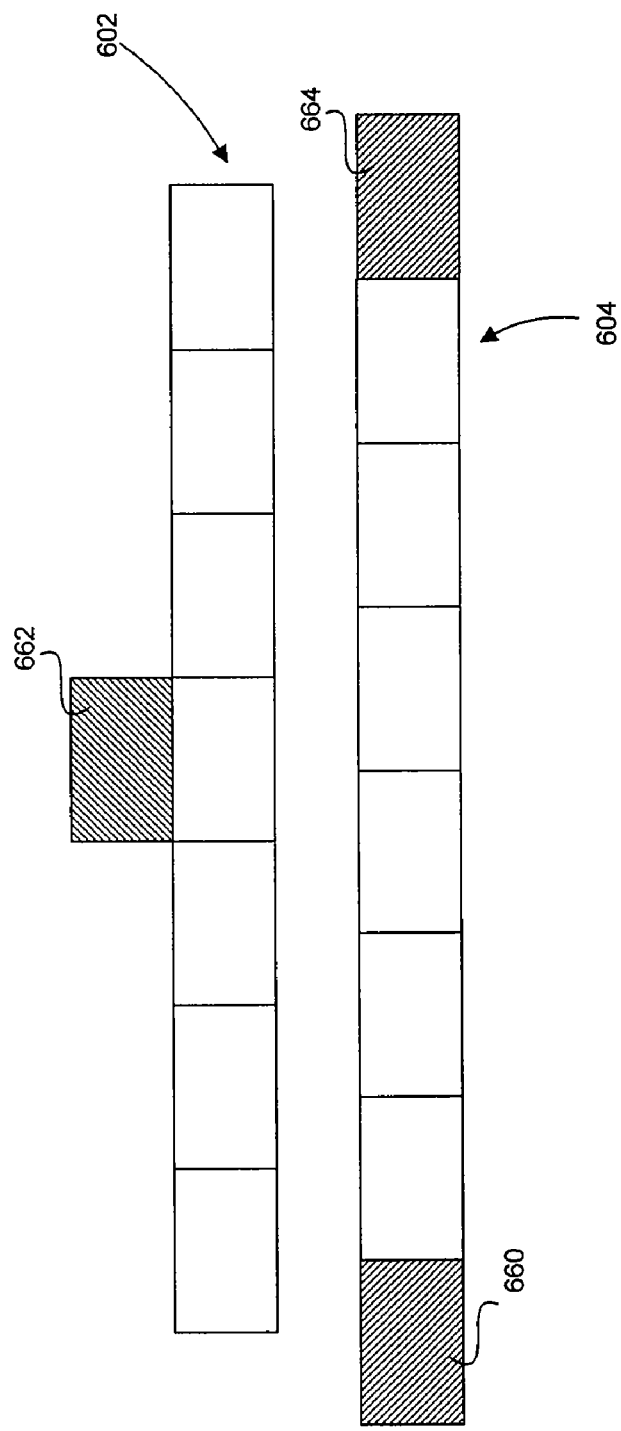
FIG. 6 depicts an assembly of telecentricity control mirrors (TCMs) that may be incorporated into the exemplary systems of FIGS. 3-5.

FIG. 6 depicts an assembly 600 of individually-controllable elements that may be incorporated into one or all of the exemplary systems of FIGS. 3-5. In one embodiment, assembly 600 comprises a plurality of telecentricity control mirror (TCM) elements, and the mirror elements may be arranged in rows shown generally at 602 and 604. Each mirror element in rows 602 and 604 may be configured, respectively, to correct an incident radiation beam for any induced telecentricity in response to a control signal received from a controller (now shown), such as TCM controller 285 in FIG. 2.

Assembly 600 also incorporates elements 660, 662, and 664 that condition a corresponding set of alignment beams (not shown), such as beams 350, 352, and 354 of FIG. 3. In one embodiment, elements 660, 662, and 664 may be fixed mirrors that reflect the incident alignment beams, although in additional elements, elements 660, 662, and 664 may be individually-controllable elements responsive to a control signal, for example the control signal that activates elements in row 602.

In the embodiment of FIG. 6, assembly 600 comprises thirteen individually-controllable mirror elements that are arranged in two rows 602 and 604 and that are movable in at least two degrees of freedom. However, TCM assembly 600 is not limited to such an arrangement. It would be understood by one skilled in the relevant art(s) upon reading this description that TCM assembly 600 may incorporate any number of elements arranged in any number of configurations. Further, it would be understood by one skilled in the relevant art(s) upon reading this description that TCM assembly 600 may incorporate elements characterized by movement in any number of degrees of freedom.

Figure 7:
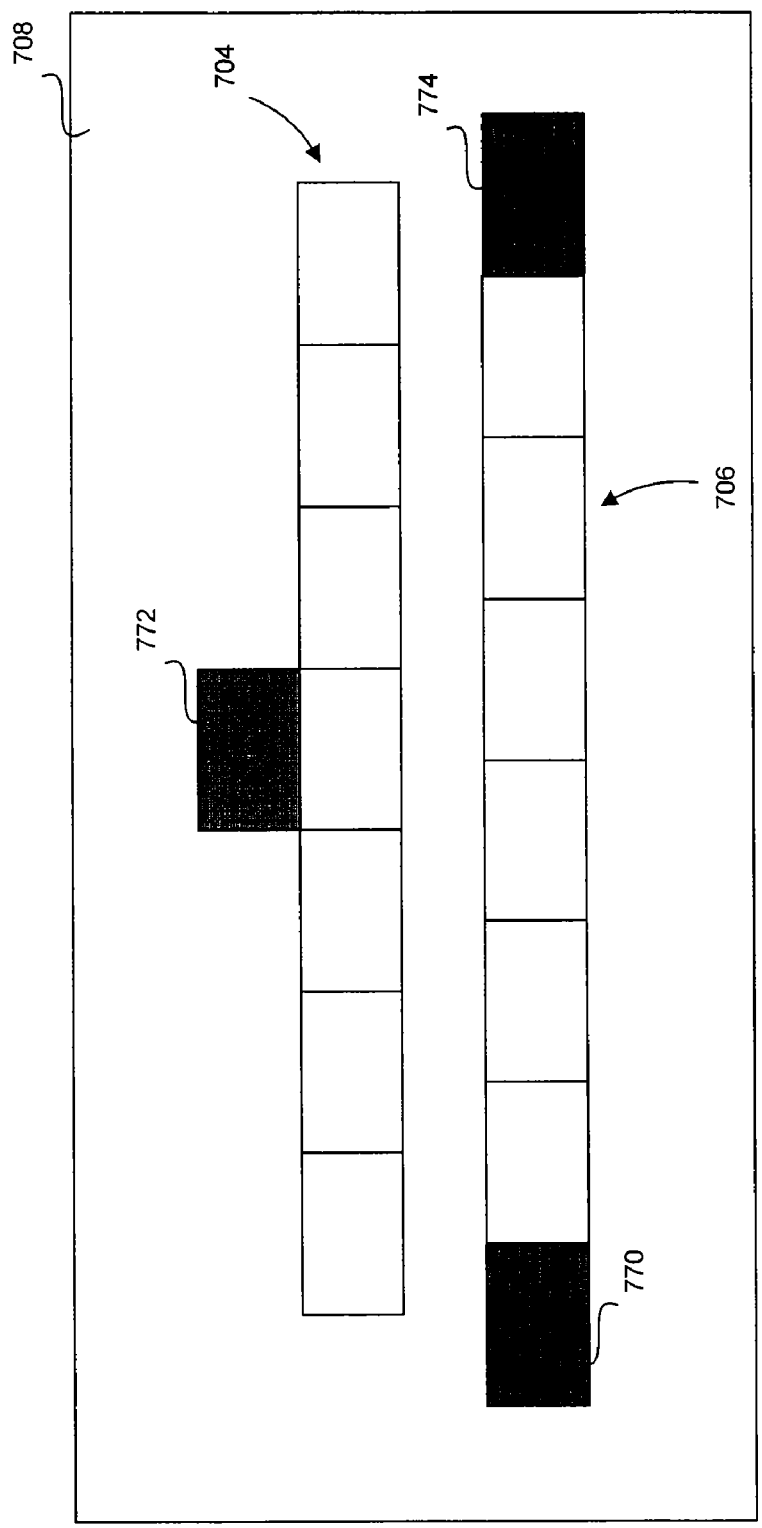
FIG. 7 depicts a patterning array that may be incorporated into the exemplary systems of FIGS. 3-5.

FIG. 7 depicts a patterning device 700 (e.g., a patterning array) that may be incorporated into one or both of the exemplary systems of FIG. 2 and FIG. 3. In one embodiment, patterning array 700 may be a multiple SLM array (MSA) that is activated by a control signal to form a specific pattern thereon. The MSA comprises a plurality of spatial light modulators (SLMs) that are arranged into rows 704 and 706 and that are respectively supported by MSA plate 708. Although not depicted in FIG. 7, MSA plate 708 may include electronics and/or circuitry that provide signals to the respective SLMs, and additional structures that provide thermal control to the respective SLMs, including, but not limited to, conduits of cooling fluid.

Patterning array 700 also includes mirror elements 770, 772, and 774, which may be fixed mirror elements, which are also supported by MSA plate 708. Fixed mirror elements 770, 772, and 774 are configured to reflect a number of incident alignment beams, such as alignment beams 270, 272, and 274 of FIG. 2, without imparting any pattern.

In the embodiment of FIG. 7, the MSA includes thirteen SLMs arranged into rows 704 and 706. However, patterning array 700 is not limited to such an arrangement. It would be understood by one skilled in the relevant art(s) that patterning array 700 may include a MSA comprising any number of SLMs disposed in any number of acceptable configurations. It would also be understood by one skilled in the relevant art(s) that patterning array 700 may incorporate any number of additional fixed mirror elements.

FIG. 8 schematically illustrates a multi-field relay (MFR) mask 800 that may be incorporated into the exemplary systems 300, 400, and 500 of FIGS. 3-5. In one embodiment, MFR mask 800 may be incorporated into a MFR module (not shown), such as MFR module 304 of FIG. 3, MFR module 404 of FIG. 4, and MFR module 504 of FIG. 5, which partitions a source radiation beam (not shown) into a plurality of beams. MFR mask 800 comprises a plurality of openings arranged in rows 802, 804, 806, and 808 and configured to partition an incident beam into a plurality of beams of actinic light to be projected onto a substrate (not shown).

In an additional embodiment, such as that described above with reference to FIG. 4, MFR mask 800 also comprises openings 810, 812, and 814 that further partition the incident radiation beam into alignment beams, such as alignment beams 440, 442, and 444 of FIG. 4. Sensors (not shown)

measure the position and angle of the partitioned alignment beams at an entrance plane of the projection system (not shown), and the measured position and angle are used to correct for any telecentricity effects in the projected beams.

In the embodiment of FIG. 8, MFR mask 800 incorporates sixteen openings to partition the source radiation beam into thirteen individual beams and three alignment beams. However, MFR mask 800 is not limited to such a configuration. It would be apparent to one skilled in the relevant art(s) that MFR mask 800 may accommodate any number of additional openings to divide a source beam into individual beams and alignment beams, and these additional opening may be arranged in any number of configurations.

FIG. 9 describes an exemplary method 900 for measuring and correcting for any telecentricity effects in a lithographic apparatus, according to an embodiment of the present invention. For example, method 900 may be executed by one or more of the systems described above with reference to FIGS. 1-8. In step 902, for example, a source radiation beam 302 is partitioned into a plurality of radiation beams 306 and 308. In one embodiment, the source radiation beam is partitioned into the plurality of radiation beams 306 and 308 using the multifield relay (MFR) module 304 or a two-dimensional diffraction grating. The plurality of alignment beams 350, 352 and 354 are generated in step 904. These alignment beams 350, 352 and 354 may follow an optical path through the lithographic apparatus similar to that of the plurality of radiation beams 306 and 308.

In one embodiment, the plurality of alignment beams 350, 352 and 354 may be generated by the corresponding plurality of radiation sources 340, 342, and 344, and the exemplary alignment sources include, but are not limited to, helium-neon (HeNe) lasers. In an alternate embodiment, both the plurality of alignment beams 350, 352 and 354 and the plurality of radiation beams 306 and 308 may be partitioned from the same source radiation beam 302. In such an embodiment, steps 902 and 904 may be executed simultaneously.

A position, an angle, and/or an energy distribution of each of the plurality of alignment beams 350, 352 and 354 are measured in step 906. The measured position, angle, and energy distribution provides a measurement of any telecentricity induced by relative movement between optical components of the lithographic apparatus. In one embodiment, the position and angle of the plurality of alignment beams 350, 352 and 354 may be measured by the corresponding plurality of sensors 380, 382, and 384, and the plurality of sensors 380, 382, and 384 may be arranged about the entrance 326 of the projection system 328 of the lithographic apparatus. In additional embodiments, the plurality of sensors 380, 382, and 384 may be arranged about any additional optical element to measure the position, angle, and/or energy distribution of the incident alignment beams.

In step 908, each of the plurality of radiation beams is corrected for any induced telecentricity measured in step 906. In one embodiment, the plurality of radiation beams 306 and 308 may fall incident onto the assembly 310 comprising a plurality of individually-controllable mirror elements. In response to the telecentricity measured in step 906, appropriate ones 311 and 313 of the individually-controllable mirror elements may activate to adjust an angle at which each of the plurality of radiation beams 306 and 308 illuminate the patterning array 320, thus correcting the plurality of radiation beams 306 and 308 for any induced telecentricity. The individually-controllable elements 311 and 313 may include, but are not limited to, mirror elements having two-degrees of freedom. Additionally, or alternatively, an angle and/or position of beams 306 and 308 may be adjusted within step 908 in response to the measured energy distribution.

In an additional embodiment, an optional telecentricity control lens 490 may be positioned upstream of the MFR module 404 that partitions the source radiation beam 402. In response to any measured telecentricity, the telecentricity control lens 490 may be positioned through two degrees of freedom to adjust a position and/or an angle of the source beam 402 in response to the measured telecentricity. In yet another embodiment, the measured telecentricity may serve to activate any combination of the telecentricity control lens 490 and the plurality of individually-controllable elements, such as elements 411 and 413, to provide a real-time correction for telecentricity within the lithographic apparatus.

Once adjusted to account for the effects of telecentricity, the plurality of adjusted radiation beams are modulated by the patterning array 320 of individually-controllable elements and projected onto a portion of a substrate by the projection system 328 in step 910. By providing for an instantaneous measurement of induced telecentricity, the exemplary system 900 corrects for the induced telecentricity without incurring the loss in substrate throughput that accompanies existing telecentricity correction techniques.

Although described embodiments of the present invention refer to mirror arrays, any suitable array of individually controllable elements may be used. Further, combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   a partitioning device configured to receive and partition a radiation beam into a plurality of radiation beams;
   a plurality of light sources configured to generate a corresponding plurality of alignment beams;
   a plurality of sensors configured to provide a measurement of at least one of an angle, a position, or an energy distribution of the plurality of alignment beams, wherein each of the sensors in the plurality of sensors is spaced apart from one another and wherein each of the sensors in the plurality of sensors corresponds to each of the alignment beams in the plurality of alignment beams;
   an array of individually-controllable elements configured to correct the plurality of radiation beams in response to the measurement by the plurality of sensors;
   an adjustable patterning device positioned optically downstream of the array of individually-controllable elements, wherein the adjustable patterning device is configured to pattern the corrected plurality of radiation beams based on the measurement; and
   a projection system configured to project the patterned plurality of radiation beams from the adjustable patterning device onto a target portion of a substrate.

2. The apparatus of claim 1, wherein the plurality of sensors and the plurality of alignment beams comprise three sensors and three alignment beams, respectively.

3. The apparatus of claim 1, wherein each of the individually-controllable elements in the array of individually-controllable elements is configured to adjust an angle at which one of the plurality of radiation beams illuminates the adjustable patterning device.

4. The apparatus of claim 1, wherein the plurality of alignment beams and the plurality of radiation beams travel along the same optical paths.

5. The apparatus of claim 1, wherein the array of individually-controllable elements is optically downstream of the partitioning device.

6. The apparatus of claim 1, wherein the array of individually-controllable elements comprises a plurality of elements configured to condition respective ones of the plurality of alignment beams.

7. The apparatus of claim 1, further comprising:
   a lens configured to adjust at least one of an angle and a position of the plurality of radiation beams in response to the measurement by the plurality of sensors.

8. The apparatus of claim 1, wherein the plurality of light sources are optically downstream of the partitioning device.

9. The apparatus of claim 8, wherein the plurality of light sources comprises helium-neon lasers.

10. The apparatus of claim 1, wherein the adjustable patterning device further comprises:
    a plurality of elements corresponding in number to the plurality of alignment beams and configured to condition the plurality of alignment beams 11. The apparatus of claim 1, wherein the plurality of sensors are located on the projection system proximate to an entrance of the projection system.

12. The apparatus of claim 1, further comprising one or more additional arrays of individually-controllable elements configured to correct respective ones of the plurality of radiation beams in response to the measurement by the plurality of sensors.

13. The apparatus of claim 1, further comprising:
    a controller configured to adjust a position of one or more elements in the array of individually-controllable elements based on the measurement provided by the plurality of sensors, thereby correcting a telecentricity of one or more of the plurality of alignment beams.

14. The apparatus of claim 1, further comprising:
    a telecentric lens positioned optically upstream of the partitioning device; and
    a controller configured to adjust a position of the telecentric lens based on the measurement provided by the plurality of sensors, thereby correcting a telecentricity of the radiation beam received by the partitioning device.

15. The apparatus of claim 1, wherein the plurality of light sources are positioned optically downstream of the partitioning device.

16. A system for measuring and correcting for telecentricity in a lithographic apparatus, comprising:
    a partitioning device configured to receive and partition a radiation beam into a plurality of radiation beams;
    a plurality of light sources configured to generate a corresponding plurality of alignment beams;
    a plurality of sensors configured to provide a measurement of at least one of an angle, a position, or an energy distribution of the plurality of alignment beams, wherein each of the sensors in the plurality of sensors is spaced apart from one another and wherein each of the sensors in the plurality of sensors corresponds to each of the alignment beams in the plurality of alignment beams;
    an array of individually-controllable elements configured to correct the plurality of radiation beams in response to the measurement by the plurality of sensors; and
    an adjustable patterning device positioned optically downstream of the array of individually-controllable elements, wherein the adjustable patterning device is configured to pattern the corrected plurality of radiation beams based on the measurement.

17. The system of claim 16, wherein the plurality of sensors and the plurality of alignment beams comprise three sensors and three alignment beams, respectively.

18. The system of claim 16, wherein each of the individually-controllable elements in the array of individually-controllable elements is configured to adjust an angle at which one of the plurality of radiation beams illuminates the adjustable patterning device.

19. The system of claim 16, wherein the array of individually-controllable elements is optically downstream of the partitioning device.

20. The system of claim 16, wherein the array of individually-controllable elements further comprises:
a plurality of elements configured to condition the plurality of alignment beams.

21. The system of claim 16, further comprising:
a lens configured to adjust at least one of an angle and a position of the plurality of radiation beams in response to the measurement by the plurality of sensors.

22. The system of claim 16, wherein the plurality of light sources are optically downstream of the partitioning device.

23. The system of claim 16, wherein the plurality of light sources comprises helium-neon lasers.

24. The system of claim 16, wherein the plurality of alignment beams and the plurality of radiation beams travel along the same optical paths.

25. The system of claim 16, further comprising a second array of individually-controllable elements configured to correct respective ones of the plurality of radiation beams in response to the measurement by the plurality of sensors.

26. A method of measuring and correcting for telecentricity in a lithographic apparatus, comprising:
measuring at least one of an angle, a position, or an energy distribution of a plurality of alignment beams with a corresponding plurality of sensors to generate a measurement signal, wherein each of the sensors in the plurality of sensors are spaced apart from one another;
adjusting a plurality of radiation beams, with an array of individually-controllable element, in response to the measuring the at least one of the angle, the position, or the energy distribution of the plurality of alignment beams;
patterning, with an adjustable patterning device, the adjusted plurality of radiation beams based on the measurement signal, wherein the adjustable patterning device is positioned optically downstream of the array of individually-controllable elements; and
projecting the patterned plurality of radiation beams onto a target portion of a substrate.

27. The method of claim 26, wherein the adjusting further comprises adjusting an angle at which the plurality of radiation beams illuminates a patterning device performing the patterning the adjusted plurality of radiation beams.

28. The method of claim 26, wherein the patterning is performed using a second array of individually-controllable elements.

29. The method of claim 26, wherein the adjusting further comprises adjusting at least one of a position and an angle of the plurality of radiation beams in response to a measured energy distribution of the plurality of alignment beams.

30. The method of claim 26, further comprising partitioning a first radiation beam to generate the plurality of radiation beams.

31. The method of claim 30, wherein the partitioning further comprises partitioning the first radiation beam into the plurality of alignment beams.

32. The method of claim 26, further comprising generating the plurality of alignment beams with a corresponding number of light sources.

33. The method of claim 32, wherein the radiation sources comprise helium-neon lasers.

\* \* \* \* \*